United States Patent [19]

St. Clair et al.

[11] Patent Number: 4,543,295

[45] Date of Patent: Sep. 24, 1985

[54] HIGH TEMPERATURE POLYIMIDE FILM LAMINATES AND PROCESS FOR PREPARATION THEREOF

[75] Inventors: Anne K. St. Clair; Terry L. St. Clair, both of Poquoson, Va.

[73] Assignee: National Aeronautics and Space Administration, Washington, D.C.

[21] Appl. No.: 663,840

[22] Filed: Oct. 24, 1984

Related U.S. Application Data

[63] Continuation-in-part of Ser. No. 189,234, Sep. 22, 1980, abandoned.

[51] Int. Cl.⁴ .............................................. B32B 15/08
[52] U.S. Cl. .................................. 428/458; 156/307.7; 156/308.2; 156/309.9; 156/331.5; 427/385.5; 427/388.1; 428/473.5
[58] Field of Search ............... 156/331.5, 307.7, 308.2, 156/309.9, 324; 427/135, 404, 407.1, 409, 338.1, 429, 385.5; 428/458, 473.5

[56] References Cited

U.S. PATENT DOCUMENTS

| | | | |
|---|---|---|---|
| 3,179,634 | 4/1965 | Edwards | 156/331.5 |
| 3,449,193 | 6/1969 | Biatton et al. | 156/324 |
| 3,608,054 | 9/1971 | Alvino et al. | 427/429 |
| 4,065,345 | 12/1977 | Progar et al. | 156/331.5 |
| 4,411,952 | 10/1983 | Sasaki et al. | 428/332 |
| 4,487,911 | 12/1984 | Lange et al. | 428/458 |

*Primary Examiner*—S. L. Childs
*Attorney, Agent, or Firm*—Wallace J. Nelson; Howard J. Osborn; John R. Manning

[57] ABSTRACT

High temperature polyimide film laminates and a process for fabricating large-area, void-free polyimide laminate structures wherein multiple-ply polyimide film laminates may be constructed without decreasing the individual film strength and wherein layers of metal foil may be laminated between polyimide film layers to yield a flexible high temperature resistant structure having capabilities for use as flexible electric circuits, in aerospace applications, and the like.

42 Claims, 14 Drawing Figures

HIGH TEMPERATURE POLYIMIDE FILM LAMINATES AND PROCESS FOR PREPARATION THEREOF

ORIGIN OF THE INVENTION

The invention described herein was made by employees of the U.S. Government and may be manufactured and used by or for the Government for governmental purposes without the payment of any royalties thereon or therefor.

This is a continuation-in-part of patent application Ser. No. 189,234, filed Sept. 22, 1980, now abandoned.

BACKGROUND OF THE INVENTION

Flexible electrical circuits are presently being used commercially in computers, cameras, telephone and PBX systems, medical equipment controls and in automobile radios. These reliable interconnection devices save space and assembly time and it is anticipated that additional uses in aerospace and other applications will be forthcoming now that electronic designers no longer regard flexible circuits as experimental but accept such circuitry as reliable. One problem that has limited their use is the ability of present flexible circuits to remain reliable under extreme temperature variations. This unreliability is due to the low thermal stability of the adhesives presently used in flexible circuit laminates. There is a definite need in the aerospace industry for reliable flexible electrical circuitry for utilizing adhesives of high thermal stability for severe temperature and pressure environments such as may be encountered in applications on missiles; aircraft and spacecraft.

Linear aromatic polyimides derived from polyamic acid precursors are excellent candidates as adhesives for such applications because they are thermally stable at temperatures between 477 K. (400° F.) and 589 K. (600° F.), flexible, and light in weight.

A problem exists, however, in using such derived adhesives to bond polyimide film to itself or to metal surfaces, such as is desired for various circuitry applications, due to the evolution of unwanted volatiles. Such volatiles can be the result of condensation reaction by-products and/or excess solvent, both of which cause difficulties in the preparation of large-area, void-free laminates. Unless features such as porous or permeable films are used (see Bratton, U.S. Pat. No. 3,449,193), sucn volatiles lead to the formation of voids and unlaminated areas in the material.

A process for laminating large areas of void-free high temperature polyimide film is needed for aerospace applications. Several years ago, a particular need for a flexible, high temperature adhesive to bond ultra-thin polyimide film was presented by the proposed NASA Solar Sail Program. A flexible adhesive was needed for joining strips of 0.002 μm (0.08 mil) DuPont polyimide Kapton ® H Film at intervals across each sail blade measuring 8 meters by 7350 meters in length. Kapton ® is available in various thicknesses and is a trademark of the DuPont Company for a linear polyimide film formed from pyromellitic dianhydride (PMDA) and 4,4'-oxydianiline (ODA). Several linear polyimide adhesives were developed for this application using the following monomers:

BTDA

PDMA

DABP

The adhesives identified as LARC-2, 3, and 4, and formulated as shown in Table I, were prepared in a nontoxic ether solvent and proved successful in bonding ¼-inch overlaps of thin polyimide Kapton ® film. The adhesives themselves showed good thermal stability when subjected to temperatures of 575 K. in excess of 500 hours and the adhesive bonds also showed excellent retention of strength after aging 6000 hours at elevated temperature. Although these ¼-inch polyimide bonds were not entirely "void-free", the adhesives were far stronger than the films they joined. A more complete description of these adhesives is found in the January 1979 issue of *Adhesive Age*, pp. 35–39, which is incorporated herein by reference.

TABLE I

| KAPTON ® ADHESIVES | | | |
|---|---|---|---|
| Resin | Formulation | Amic Acid $n_{inh}$ | $T_g$ K (°F.) |
| LARC-2 | BTDA 3,3'-DABP | 0.70 | 520 (477) |
| LARC-3 | 2 BTDA/1 PMDA 3,3'-DABP | 0.63 | 542 (516) |
| LARC-4 | 3 BTDA/1 PMDA 4,4'-DABP | 0.50 | 570 (567) |

The ¼-inch overlap of the polyimide bonds described above is small enough in area to provide escape for a large portion of volatiles. A definite need still exists for a method for joining larger areas of polyimide film, so as to produce 100% void-free laminates.

Void-free laminates of thin polyimide film are deemed useful in high temperature packaging or encapsulating for the purpose of environmental protection. The "through-the-thickness" (TTT) strength of thick commercial polyimide film, Kapton ® for example, is very poor and prohibits the use thereof in certain applications. However, by use of the present invention, thick laminates of the commercially thin film can be produced without decreasing the individual layer (TTT) strength and thereby yield a thick polyimide laminate having improved physical property characteristics. It is also anticipated that polyimide film and laminates thereof constructed according to the present invention will prove useful as coatings wherein, the polyimide film is primed with an adhesive in accordance with this invention, and the film bonded to different substrates to serve as a protective high temperature resistant coating thereon.

It is therefore an object of the present invention to provide an improved process for bonding high temperature polyimide film.

Another object of the present invention is a method for preparing flexible, large-area, 100% void-free laminates from polyimide film.

Another object of the present invention is an improved method for laminating polyimide film to itself and/or to metal surfaces for ultimate use in flexible circuit applications.

An additional object of the present invention is the use of a thermoplastic bonding process to make laminates free of solvents and voids to obtain high temperature resistant polyimide laminate structures.

Yet another object of the present invention is to provide void-free polyimide and polyimide-metal laminates.

BRIEF DESCRIPTION OF THE INVENTION

According to the present invention, the foregoing and additional objects are attained by coating at least one surface of the polyimide film to be laminated with a thin layer of a linear polyamic acid adhesive solution, subjecting the coated film to temperature to effect substantially complete imidization of the adhesive, and thermoplastically bonding or laminating the coated film with another coated or uncoated polyimide film using temperature and pressure. As an alternate process, polyamic acid adhesive film may be imidized by preheating to form a free film of polyimide adhesive prior to being placed between the polyimide film layers. When using either process to produce flexible circuits, a conductive metal film layer can be interposed between layers of the polyimide film or bonded to one or both sides of one layer of polyimide film. Also, a laminate can be formed of two layers of conductive metal film bonded together by an intermediate layer of the imidized adhesive. The resulting structure is an essentially void-free laminate having one or more layers of polyimide film bonded to one or more layers of metal.

As used herein, it will be understood that the term "imidize" or "imidized" means substantially complete imidization.

A more complete appreciation of the invention and many of the attendant advantages thereof will be readily apparent by reference to the following detailed description and specific examples and when considered in connection with the accompanying drawings wherein:

DETAILED DESCRIPTION

Figure 1:
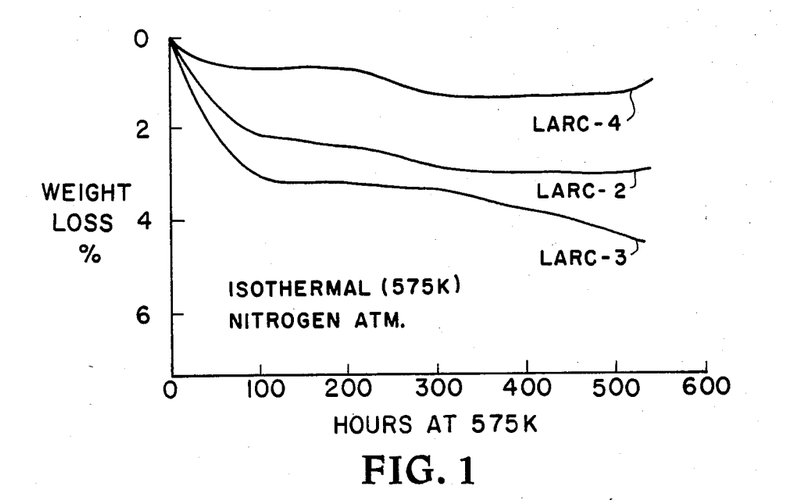
FIG. 1 is a graphic illustration of the thermal stability of the adhesives employed in the present invention.
Figure 2:
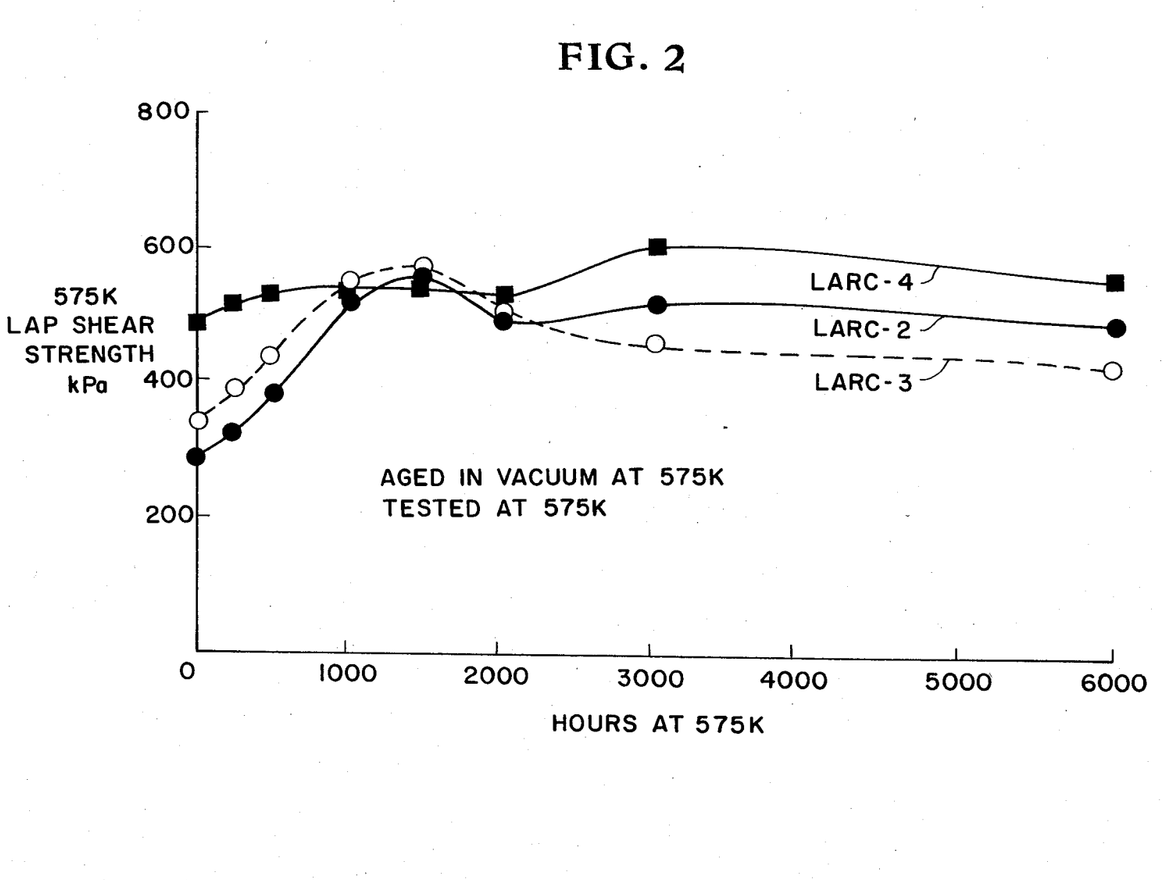
FIG. 2 is a graphic illustration of the adhesive strength exhibited by the adhesive bonds of the present invention when exposed to elevated temperatures.

Referring now to the drawings, FIG. 1 shows a graphic illustration of the excellent thermal stability properties of the various adhesives employed in the present invention when subjected to temperatures of 575 K. for an excess of 500 hours. FIG. 2 shows a graphic illustration of the retention of strength for the various adhesives after 6000 hours exposure at elevated temperature.

Figure 3:
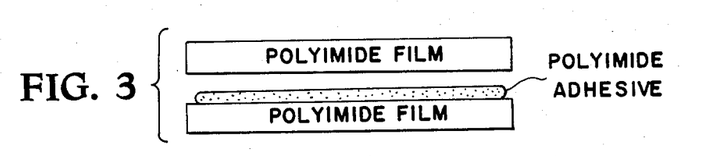
FIG. 3 is a schematic illustration of the liquid adhesive applied to one sheet of a pair of polyimide film sections to be bonded according to the present invention.

One process for producing large-area polyimide film laminates according to the present invention involves the following steps: (1) the polyimide film to be laminated is primed with a thin coat of a linear polyamic acid adhesive solution; (2) the primed polyimide film is then imidized by preheating to 493 K. (428° F.) in air for one hour to remove excess solvent and convert the polyamic acid adhesive to the more stable polyimide; (3) the imidized film is then thermoplastically bonded to another sheet of primed film or unprimed film, as shown in FIG. 3, in a steel mold (FIG. 6) at 616 K. (650° F.) for five minutes under 50–300 psi pressure; and (4) the polyimide film laminate is cooled under pressure before removing from the mold. The resulting laminate is clear yellow, extremely flexible, and 100% void-free. It cannot be peeled and attempts at peeling the laminate cause failure to occur in the film itself.

Figure 4:
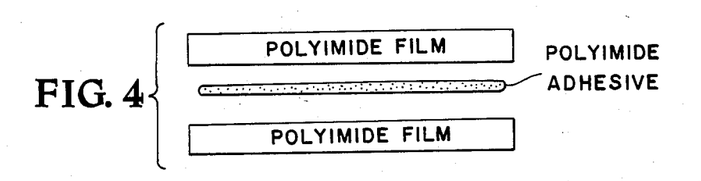
FIG. 4 is a view similar to FIG. 3 illustrating the use of an imidized adhesive film as the bonding agent between two sheets of polyimide film.

A second process for producing large area polyimide film laminates according to the present invention involves the following steps: (1) a thin film of the polyamic acid adhesive is fabricated by casting the solution on a flat surface; (2) the polyamic acid adhesive film is thermally imidized to the polyimide by heating in air to 493 K. (428° F.) for one hour; (3) the adhesive film is then stripped from the casting surface and placed between two sheets of polyimide film to be laminated, as shown in FIG. 4; (4) the sandwich prepared as in step 3 is placed in a steel mold (FIG. 6) and thermoplastically laminated at 616 K. (650° F.) for five minutes under 50–300 psi pressure; and (5) the polyimide laminate is cooled under pressure.

Successful laminates prepared by the processes described in the present invention were made from polyimide film using the following film thicknesses: 0.013 mm (0.5 mil), 0.025 mm (1 mil), 0.076 mm (3 l mil), and 0.127 mm (5 mil). However, other film thicknesses should also produce good laminates. The film was cleaned prior to bonding with a cloth containing ethanol. Any other solvent useful in removing dust particles, fingerprints, etc. should be acceptable in preparing the film for lamination. Although DuPont's Kapton ® H film was used to produce the polyimide film laminates described in most of the Examples herein, other linear aromatic polyimide films may also be used for lamination by the process of the present invention.

For example, polyimide film which may be employed in the lamination process of the present invention are selected from the group of polyimides having the following structure:

where Ar is either of where Z is selected from $$-O-, -\overset{O}{\underset{\|}{C}}-, -C(CF_3)_2-, -S-, -SO_2-,$$

and Ar' is either of where Z' is selected from $$-O-, -\overset{O}{\underset{\|}{C}}-, -S-, -SO_2-, -CH_2-, -C(CH_3)_2-, \text{ and}$$

$$-CHOH-.$$

The thermoplastic polyimide adhesives used for fabricating the laminates described in the present invention were prepared using the linear aromatic LARC polyamic acid solutions in Table I. The LARC-2, 3, and 4 solutions were used at a concentration of 15% solids in N,N'-dimethylacetamide (DMAc) or bis(2-methoxyethyl)ether (diglyme). Other useful solvents may include amide-type solvents such as N,N-dimethylformamide, N-methyl-2-pyrrolidone, and dimethylsulfoxide or ether-type solvents such as tetrahydrofuran, m- and p-dioxane, and 1,2-bis(2-methoxyethoxy)ethane. Also, other solids concentrations can be used as long as adequate flow characteristics are maintained to form a thin film.

The imidizing step should be varied depending upon the adhesive and solvent used. When DMAc was used as a solvent for the adhesive, imidization was achieved by heating the adhesive film or polyimide film coated with adhesive directly in air to 493 K. (428° F.) and holding at temperature for one hour. However, when diglyme was used as the adhesive solvent, it was necessary to carry out the imidization more slowly so as not to foam the adhesive. The imidization for diglyme-containing adhesives consisted of heating in air one-half hour at 373 K. (212° F.), one hour at 452 K. (356° F.), and one hour at 493 K. (428° F.). Ultimate success in obtaining a void-free laminate depends on the imidization step for substantially complete removal of solvent and the substantially complete thermal conversion of the adhesive polyamic acid to the polyimide prior to laminating.

Although the LARC polyamic acids were used as adhesives for the specific example illustrations of the present invention, other linear aromatic polyamic acids/polyimides may be employed as long as they are processed correctly to ensure substantially complete solvent removal and imidization. Also, a candidate adhesive solution for the lamination process described herein must produce a polyimide with a glass transition temperature (or softening temperature) low enough so as to remain processable during lamination.

Although 616 K. (650° F.) was specified as the laminating temperature in the above processes, longer time at a lower temperature or shorter time at a higher temperature could also be used to prepare a laminate of the same quality. When a laminating temperature of 644 K. (700° F.) was used for five minutes, the resulting laminate was very dark indicating that decomposition of the polymers had begun to occur. Best results were obtained when the press was preheated to 505 K. (450° F.) before inserting the laminate mold. The temperature of the press platens was then raised directly to 616 K. (650° F.) and held for five minutes. The platens were air-cooled to within 373 K. (212° F.) before opening.

Successful lamination of the polyimide film occurred using pressures of 50 psi, 150 psi, and 300 psi. Lower pressures might be used if pressure were applied evenly. Pressures as high as 1000 psi were attempted, but with no visible improvement in the quality of the resulting laminate. For best results, the pressure was applied as soon as the laminate mold was placed between the preheated platens; and that same pressure was maintained until after the platens had cooled. Bumping (release of pressure followed by reapplying the same pressure) was attempted on several of the laminates after the maximum temperature was reached. The bumping technique often used to allow the escape of excess volatiles proved to be unnecessary in the preparation of 100% void-free laminates and was discarded. The ultimate success in achieving a well-consolidated polyimide laminate was found to be dependent upon attaining an even distribution of pressure. The use of several layers of woven glass fabric (FIG. 6) between the polyimide film laminate and the steel mold served to evenly distribute the pressure on the laminate. The laminating process was also carried out with a vacuum bag surrounding the laminate mold, but evacuating the system did not produce better laminates.

Figure 5A:
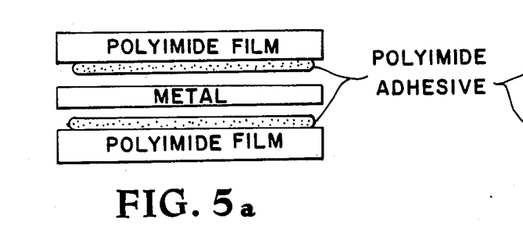
FIG. 5a is a schematic illustration of a metal layer positioned between two sheets of adhesive coated polyimide films prior to pressure molding thereof to encase the metal film.
Figure 5B:
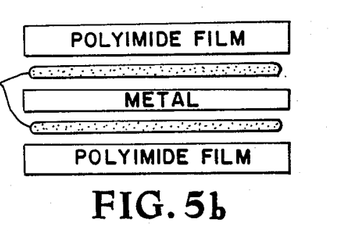
FIG. 5b is an illustration similar to FIG. 5a illustrating the use of imidized polyimide adhesive film as the adhesive agent.

The above described processes for laminating polyimide film are also used to prepare metal-containing laminates for use as flexible circuits and the like. The first process may be adapted by placing a conductive metal sheet or foil between two sheets of polyimide film that has been primed with adhesive and imidized shown in FIG. 5a. The second described process may be modified by placing a sheet of imidized adhesive film and polyimide film to be laminated on both sides of the metal forming a sandwich as shown in FIG. 5b. Although, aluminum, brass, copper, chromium, titanium, and stainless steel have been successfully laminated to polyimide film using the process, other metals, metal alloys or metal-coated film may be employed and are considered within the scope of this invention. The metals need only to be degreased with a solvent such as ethanol or methylethylketone prior to laminating, although a more strenuous surface preparation may be used when desired. Suitable flexible electrical circuits are prepared from the polyimide-metal laminates.

Polyimide film laminates have been prepared using the above described processes that vary in size from 77.4 cm$^2$ (12 in$^2$) to 645 cm$^2$ (100 in$^2$). Larger area laminates can be made using the present processes as long as the entire area of lamination receives even temperature and pressure. The thickness of the laminate may also be varied. An 8-ply polyimide film laminate (FIG. 7) was successfully prepared that was 100% void-free and flexible. Thicker laminates can be fabricated as long as the temperature and pressure demands are met.

Figure 8:
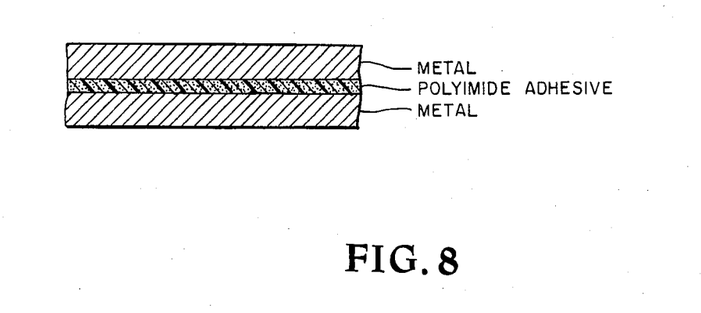
FIG. 8 is a sectional view of still another embodiment of the present invention having two layers of metal bonded together by an intermediate layer of imidized adhesive.

FIG. 8 shows another embodiment of the present invention wherein two layers of metal sheet or foil are bonded together by an intermediate layer of polyimide adhesive. The adhesive may be either coated on one or both internally facing metal surfaces as a polyamic acid and then imidized prior to bonding; or, the adhesive layer may be formed as a free film, as previously described. The various layers are stacked up in the order shown and then subjected to heat and pressure to effect void-free thermoplastic bonding as more fully discussed above.

Figure 9A:
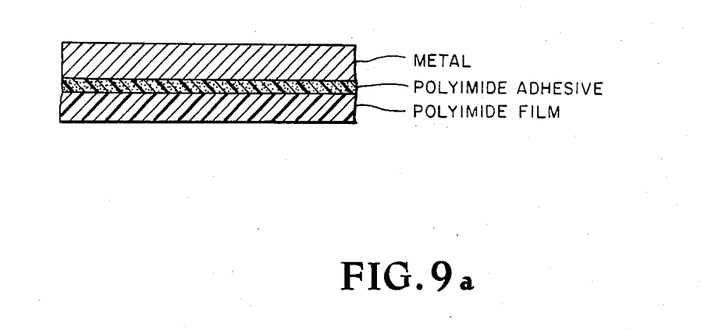
FIG. 9a is a sectional view of another embodiment of the present invention having a layer of metal film bonded to a layer of polyimide film by an intermediate layer of imidized adhesive.
Figure 9B:
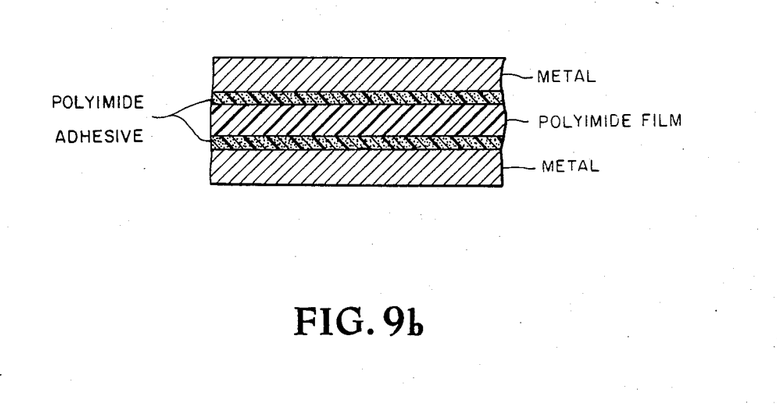
FIG. 9b is a sectional view of still another embodiment of the present invention having a central layer of polyimide film bonded or sandwiched between two outer layers of metal film by two intermediate layers of imidized adhesive.

FIGS. 9a and 9b shows two more embodiments of the present invention particularly suitable for use in making flexible printed circuitry. In the embodiment of FIG. 9a a laminate is formed of a layer of metal, preferably copper, bonded to a layer of polyimide film, such as Kapton ®, by an intermediate layer of polyimide adhesive. The various layers are stacked up in the order shown and then subjected to heat and pressure to effect void-free thermoplastic bonding as more fully discussed above. In the embodiment of FIG. 9b, a laminate is formed of a layer of polyimide film, such as Kapton ®, sandwiched between outer layers of metal, preferably copper. An intermediate layer of polyimide adhesive bonds each layer of metal to the intermediate layer of polyimide film. The adhesive may be coated onto either the metal or polyimide film surfaces as a polyamic acid and then fully imidized prior to bonding; or, the adhesive layer may be formed as a free film, as previously described. The various layers are stacked up in the order shown and then subjected to heat and pressure to effect void-free thermoplastic bonding as more fully discussed above.

Figure 9C:
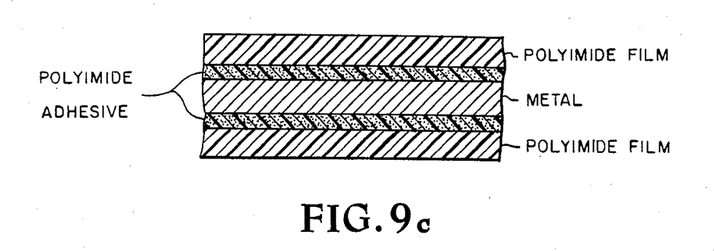
FIGS. 9c and 9d show the embodiments of FIGS. 9a and 9b with the addition of protective layers of polyimide film.
Figure 9D:
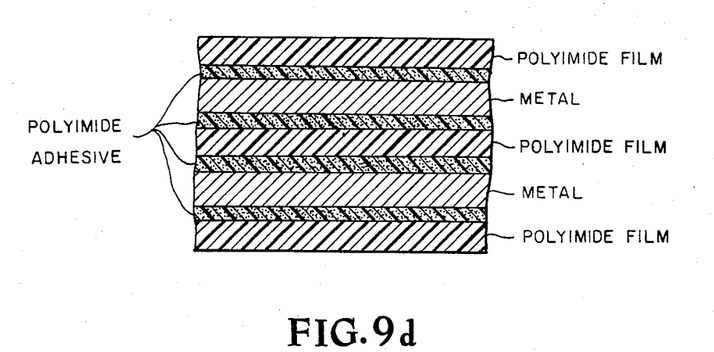

The laminates of FIGS. 9a and 9b are formed into circuit elements by any known printed circuit or similar known techniques. After formation of the desired circuit pattern on one or both metal layers; the metal layers of the embodiment of FIGS 9a and 9b may be covered with a protective insulating layer of polyimide film bonded to the metal layer by another layer of polyimide adhesive formed by imidization of a polyamic acid as discussed above. With regard to the embodiment of FIG. 9a, the addition of that protective layer of polyimide film would result in a laminate as shown in FIG. 9c, which is essentially as in the embodiment of FIG. 5a, wherein the central metal layer was in the form of a desired circuit pattern rather than being a continuous monolithic sheet or layer. Similarly, the addition of that protective layer of polyimide film to each outer circuit layer of the embodiment of FIG. 9b would result in a laminate as shown in FIG. 9d.

Figure 9E:
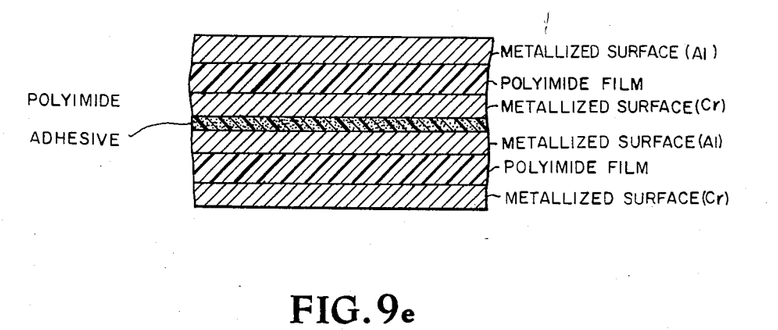
FIG. 9e is a sectional view of another embodiment of the present invention wherein two layers of aluminum/chrome metallized polyimide film are bonded together by an intermediate layer of imidized adhesive.

The laminate of FIG. 9e is formed by bonding aluminum and/or chromium-metallized polyimide film using the imidized adhesive of the present invention. Such a formulation is particularly useful in large space structural applications where adhesive joints are needed to bond large areas of metallized polyimide film.

It is, of course, understood that other laminates of any desired number of layers of metal and polyimide film can be constructed according to the present invention.

SPECIFIC EXAMPLES

Example 1

A 7.6 cm (3 in.)×10.2 cm (4 In.) polyimide film laminate was prepared from 0.076 mm (3 mil) Kapton ® H Film using LARC-2 (Table I) polyamic acid in diglyme as an adhesive. The Kapton ® film was brush-coated at room temperature with the LARC-2 adhesive solution and placed in a low humidity environment (approximately 20%) for fifteen minutes. The Kapton ® film primed with adhesive was then heated in a forced air oven for one-half hour at 373 K. (212° F.), one hour at 453 K. (356° F.), and one hour at 493 K. (428° F.) to complete imidization. The primed and imidized film was cooled to within 373 K. (212° F.) before removing from the oven. At this stage the adhesive coating was free of excess solvent, thermally imidized, and measured approximately 0.013 mm (0.5 mil) in thickness.

Figure 6:
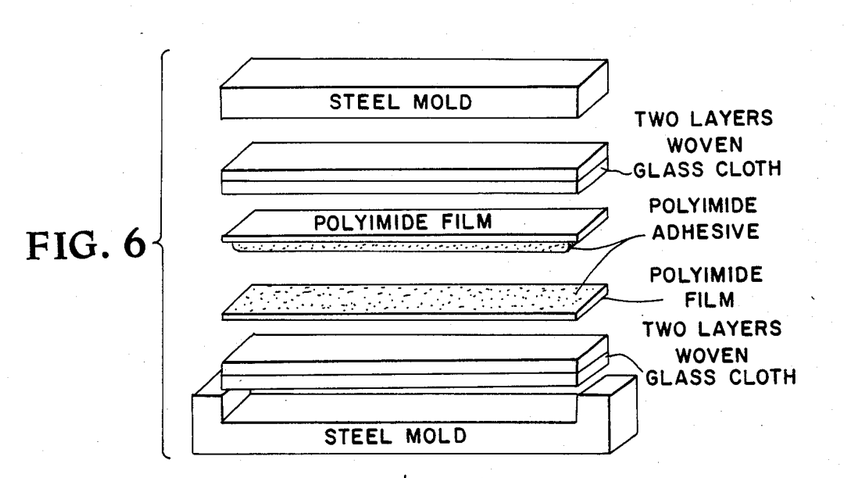
FIG. 6 is a schematic illustration of the mold assembly for laminating two layers of polyimide film according to the present invention.

The laminate was then assembled as shown in FIG. 6 in a steel mold previously sprayed with a suitable release agent (Teflon, Freekote, or the like), and inserted between press platens preheated to 505 K. (450° F.). A pressure of 300 psi was applied and maintained. The mold was heated directly to 616 K. (650° F.) and the temperature held for five minutes. The laminate was cooled under pressure to 373 K. (212° F.).

The resulting laminate was clear yellow, entirely flexible, and 100% void-free. Peeling was attempted but failure occurred first in the polyimide film.

Example 2

A 7.6 cm (3 in)×10.9 cm (4 in) polyimide film laminate was prepared from 0.025 mm (1 mil) Kapton ® film using LARC-2 adhesive in DMAc. An adhesive film was prepared by casting a 15% DMAc solution of LARC-2 onto a glass plate and imidizing in a forced air oven at 493 K. (428° F.) for one hour. The oven was cooled to within 373 K. (212° F.) before removing the glass plate. The plate was then immersed under tap water and the 0.025 mm (1 mil) thick adhesive film was removed from the plate and dried. The adhesive film was sandwiched between two sheets of Kapton ® film (FIG. 4) with two layers of cloth on each side of the laminate and placed in a steel mold as illustrated in FIG. 6. The laminating process and results were the same as for Example 1.

Example 3

A Kapton ® laminate was successfully prepared as in Example 1 using LARC-3 in diglyme as the adhesive solution.

Example 4

A Kapton ® laminate was prepared as in Example 1 combining a sheet of unprimed Kapton ® with a sheet of adhesive-primed Kapton ®. Coating only one of the Kapton ® sheets with adhesive made no difference in the resulting laminate, which was flexible and void-free.

Example 5

A large area, 25.4 cm (10 in)×25.4 cm (10 in), Kapton ® laminate was successfully prepared as in Example 1.

Example 6

A Kapton ® laminate was successfully prepared as in Example 1 using a pressure of 50 psi throughout the lamination.

Example 7

A Kapton ® laminate was successfully prepared as in Example 1 using 0.013 mm (0.5 mil) Kapton ®.

Example 8

A Kapton ® laminate was successfully prepared as in Example 1 using 0.127 mm (5 mil) Kapton ®.

Example 9

Figure 7:
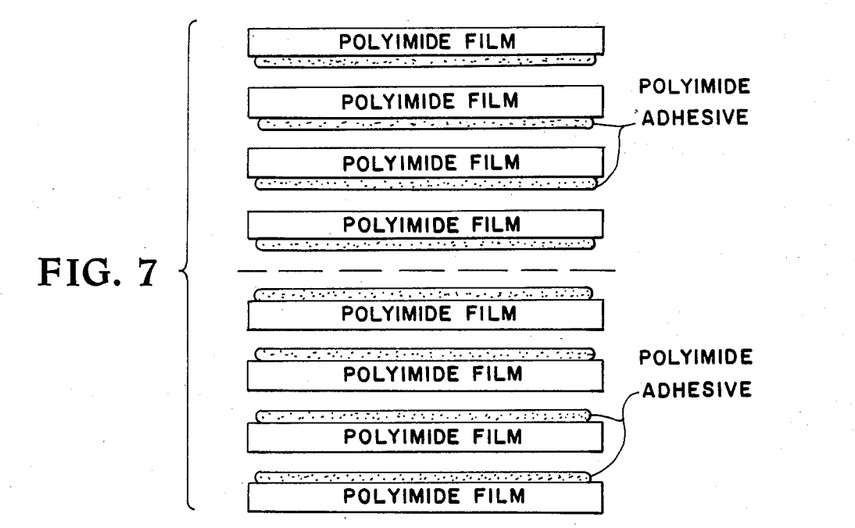
FIG. 7 is a schematic illustration of multiple layers of polyimide film in position for laminating according to the present invention.

A Kapton ® laminate comprised of eight plies was successfully prepared as in Example 1. The eight plies were assembled as shown in FIG. 7.

Example 10

A Kapton ®/aluminum/Kapton ® laminate was successfully prepared as in Example 1. The laminate was assembled according to the diagram in FIG. 5a using thin commercial aluminum foil as the metal.

Example 11

A Kapton ®/brass/Kapton ® laminate was successfully prepared as in Example 10.

Example 12

A Kapton ®/copper/Kapton ® laminate was successfully prepared as in Example 10.

Example 13

A Kapton ®/stainless steel/Kapton ® laminate was successfully prepared as in Example 10.

Example 14

A 7.6 cm (3 in)×10.2 cm (4 in) polyimide film laminate was prepared using 0.025 mm (1 mil) BTDA+ODA polyimide film with LARC-2 polyamic acid in diglyme as an adhesive.

The BTDA+ODA polyimide film to be laminated was prepared by reacting a 1:1 stoichiometric ratio of 4,4'-benzophenone tetracarboxylic dianhydride (BTDA) and 4,4'-oxydianiline (ODA) in DMAc at 15% solids by weight. The resulting high molecular weight polyamic acid which gave an inherent viscosity of 1.14 was cast onto a glass plate and heated in a forced air oven one hour at 300° C. The polyimide (BTDA+ODA) film which was formed on curing was removed from the plate and used as an adherend for the LARC-2 adhesive.

Example 15

A titanium/adhesive/titanium laminate was successfully prepared as in Example 1. The laminate was assembled as shown in FIG. 8 using 20 mil thick 6Al-4V titanium adherends as the metal.

Example 16

A laminate of aluminum/chrome-metallized (via vapor deposition) Kapton ® film was prepared successfully by the method of Example 1. The laminate was assembled as shown in FIG. 9e with the Kapton ® film surface metallized with 150 Å chromium being bonded to a Kapton ® film surface metallized with 1000 Å aluminum.

Example 17

A Kapton ®/copper laminate was successfully prepared as in Example 1. The laminate was assembled according to the diagram in FIG. 9a using 1 mil thick commercial copper foil as the metal and 3 mil Kapton ® film.

Example 18

A copper/Kapton ®/copper laminate was successfully prepared as in Example 1. The laminate was assembled according to the diagram in FIG. 9b using 1 mil thick commercial copper foil as the metal and 3 mil Kapton ® film. The LaRC-2 adhesive was applied to both sides of the Kapton ® film and imidized prior to bonding.

The foregoing specific Examples are exemplary and are not to be considered as exhaustive but merely to illustrate applicants' invention without serving as limitations thereon.

Obviously, there are many variations and modifications of the present invention in the light of the above teachings. It is therefore to be understood that within the scope of the appended claims the invention may be practiced otherwise than as specifically described.

What is claimed as new and desired to be secured by Letters Patent of the United States is:

1. A process for laminating high temperature resistant polyimide film comprising the steps of:
   providing at least two layers of a thin polyimide film;
   providing at least one layer of polyimide adhesive on one of said at least two layers of polyimide film;
   assembling said two layers of polyimide film to form a sandwich;
   said polyimide adhesive layer being a polyamic acid that is imidized to the polyimide state prior to assembling of the polyimide film sandwich; and
   subjecting the film-adhesive sandwich to heat and pressure to thermoplastically bond the sandwich into a void-free laminate structure.

2. The process of claim 1 wherein the polyimide adhesive is in liquid form and is coated on only one layer of polyimide film and this coated layer is heated to an elevated temperature to imidize the adhesive layer prior to assembly of the sandwich.

3. The process of claim 2 wherein the coating adhesive and polyimide film layers are subjected to low humidity environment for fifteen minutes and thereafter heated in a forced air oven for one-half hour at 373 K.;
   heated to and maintained for one hour at 493 K.;
   cooled to 373 K. prior to being removed from the oven and permitted to cool to room temperature to yield an imidized adhesive film on the polyimide film of approximately 0.5 mil thickness.

4. The process of claim 1 wherein a film of polyimide adhesive is prepared and imidized prior to being positioned on one of the layers of the polyimide film.

5. The process of claim 3 including:
   providing a steel pressure mold;
   spraying a thin layer of a release agent on the mold surface;
   preheating the steel press platens to 505 K.;
   inserting the polyimide film-adhesive sandwich between the press platens and applying a pressure in the range of 50-300 psi thereto;
   heating the press platens to 616 K. and maintaining this temperature and pressure for five minutes;
   cease heating and permit cooling to 373 K.;
   removing the imidized sandwich from the pressure mold and permitting it to cool to room temperature to recover a clear flexible void-free laminate structure.

6. The process of claim 4 including:
   providing a steel pressure mold;
   spraying a thin layer of a release agent on the mold surface;
   preheating the steel press platens to 505 K.;
   inserting the polyimide film-adhesive sandwich between the press platens and applying a pressure in the range of 50-300 psi thereto;
   heating the press platens to 616 K. and maintaining this temperature and pressure for five minutes;
   cease heating and permit cooling to 373 K.;
   removing the imidized sandwich from the pressure mold and permitting it to cool to room temperature to recover a clear flexible void-free laminate structure.

7. The method of claim 1 wherein the polyimide film layers are selected from the group consisting of polyimides formed as the reaction product of (a) pyromellitic dianhydride and 4,4'-oxydianiline and (b) 3,3', 4,4'-benzophenone tetracarboxylic dianhydride and 4,4'-oxydianiline.

8. The method of claim 1 wherein the polyimide adhesives are selected from the adhesive group consisting of the reaction product of (a) 3,3', 4,4'-benzophenone tetracarboxylic dianhydride and 3,3' dianimohenzophenone, (b) two parts 3,3', 4,4'-benzophenone tetracarboxylic dianhydride plus one part pyromellitic dianhydride and 3,3'-diaminohenzophenone, and (c) three parts 3,3', 4,4'-benzophenone tetracarboxylic dianhydride plus one part pryomellitic dianhydride and 4,4'-diaminohenzophenone, with the members of each group being employed in a concentration of approximately 15% solids in one member of the solvent group consisting of N,N'-dimethylacetamide and bis(2-methoxyethyl)ether.

9. The process of claim 1 wherein a layer of conductive metal film is also provided between each two layers of polyimide film and a layer of polyimide adhesive is provided adjacent each surface of the metal film layer.

10. The process of claim 9 wherein the metal film layer is selected from the group consisting of aluminum, brass, copper, chromium, titanium, stainless steel and alloys thereof, and each member of the group being in the thickness range of 1 mil to 30 mil.

11. A process for laminating high-temperature polyimide film and metal foil comprising the steps of:
    providing at least two layers of thin polyimide film;
    providing a metal foil layer between two layers of the polyimide film;
    providing a thermoplastic polyimide adhesive layer between each surface of the metal foil layer and the adjacent polyimide film layer;
    assembling the polyimide film, metal foil and adhesive so as to give film-adhesive-metal-adhesive-film sandwich;
    said polyimide adhesive layer being a polyamic acid that is imidized to remove its solvent and converted to the polyimide state prior to the step of assembling the sandwich; and
    subjecting the sandwich assembly to heat and pressure to thermally bond the sandwiched assembly into a void-free laminate structure.

12. The process as in claim 11 wherein the metal foil layer is selected from the group of metal foils consisting of copper, stainless steel, chromium, titanium, aluminum, brass and alloys thereof.

13. The process of claim 11 wherein the polyimide adhesive is applied to the laminate surfaces in liquid form and consists of a polyamic acid dissolved in a solvent.

14. The process of claim 11 wherein the polyimide adhesive is a thin film of a polyimide that has been previously imidized.

15. The process of claim 11 wherein the polyimide adhesive is a linear polyamic acid adhesive solution selected from the group consisting of:
    (a) 3,3', 4,4'-benzophenone tetracarboxylic dianhydride and 3,3' diaminohenzophenone;
    (b) two parts 3,3', 4,4'-benzophenone tetracarboxylic dianhydride to one part pyromellitic dianhydride and 3,3-diaminohenzophenone; and
    (c) three parts 3,3', 4,4'-benzophenone tetracarboxylic dianhydride to one part pyromellitic dianhydride and 4,4'-diaminohenzophenone, each group member being dissolved in a solvent.

16. The process of claim 15 wherein the adhesive solid concentration is approximately 15% and the solvent is selected from the group consisting of N,N'-dimethylacetamide, bis(2-methoxyethyl)ether, N,N-dimethylformamide, N-methyl-2-pyrrolidone, dimethylsulfoxide, tetrahydrofuran, m-dioxane, p-dioxane and 1,2-bis(2-methoxyethoxy)ethane.

17. The process of claim 15 wherein the solvent is N,N'-dimethylacetamide and the adhesive is imidized prior to lamination by applying a thin layer of the liquid adhesive to a smooth surface and heating to approximately 493° F. in air and maintaining this temperature for approximately one hour to recover a thin film of polyimide adhesive.

18. The process of claim 15 wherein the solvent is bis(2-methoxyethyl)ether and the adhesive is imidized by applying a thin coat of the liquid adhesive onto a smooth surface and heating in air to approximately 373° F. and maintaining this temperature for approximately one-half hour, increasing and maintaining the temperature to 453° F. for approximately one hour and further increasing and maintaining the temperature to 493° F. for an additional hour to recover a thin film of polyimide adhesive.

19. A process for forming a laminate structure including the steps of:
providing at least one layer of a thin polyimide film;
providing at least one layer of a thin metal film;
forming a layer of polyimide adhesive by forming a layer of polyamic acid and imidizing said layer of polyamic acid to form said layer of polyimide adhesive;
positioning said layers of polyimide film and metal with said layer of polyimide adhesive therebetween; and
bonding said layers of polyimide film and metal together under heat and pressure to form a substantially void-free laminate.

20. The process of claim 19 wherein said step of forming a layer of polyimide adhesive includes:
applying a layer of polyamic acid dissolved in a solvent to one surface of a layer to be laminated; and
heating said layer of polyamic acid to imidize said layer to form said layer of polyimide adhesive.

21. The process of claim 20 wherein:
said layer of polyamic acid is applied to said layer of polyimide film.

22. The process of claim 19 wherein said step of forming a layer of polyimide adhesive includes:
forming a layer of polyamic acid on a support surface, heating said polyamic acid layer to form a layer of polyimide film, and removing said polyimide film from said support.

23. The process of claim 19 wherein said step of bonding includes: placing said layers of polyimide film, polyimide adhesive and metal in a press and subjecting said layers to heat and pressure.

24. The process of claim 23 wherein the polyimide adhesive is a linear polyamic acid adhesive solution selected from the group consisting of:
(a) 3,3', 4,4'-benzophenone tetracarboxylic dianhydride and 3,3'-diaminohenzophenone;
(b) two parts 3,3', 4,4'-benzophenone tetracarboxylic dianhydride to one part pyromellitic dianhydride and 3,3'-dianimohenzophenone; and
(c) three parts 3,3', 4,4'-benzophenone tetracarboxylic dianhydride to one part pyromellitic dianhydride and 4,4'-diaminohenzophenone, each group member being dissolved in a solvent.

25. A laminate of high temperature resistant polyimide film comprising of:
at least two layers of a thin polyimide film; and
at least one layer of polyimide adhesive between said at least two layers of polyimide film;
said two layers of polyimide film and said layer of adhesive forming a sandwich;
said polyimide adhesive layer being a polyamic acid imidized to the polyimide state prior to assembling of the polyimide film sandwich; and
said film-adhesive sandwich having been formed by heat and pressure to thermoplastically bond the sandwich into a void-free laminate structure.

26. The laminate process of claim 25 wherein:
said polyimide adhesive is coated on only one layer of polyimide film as a polyamic acid and this coated layer is heated to an elevated temperature to imidize the adhesive layer prior to assembly of the sandwich.

27. The laminate of claim 25 wherein: said layer of polyimide adhesive is prepared and imidized to form a free film prior to being positioned on one of the layers of the polyimide film.

28. The laminate of claim 25 wherein: the polyimide film layers are selected from the group consisting of polyimides formed as the reaction product of (a) pyromellitic dianhydride and 4,4'-oxydianiline and (b) 3,3', 4,4'-benzophenone tetracarboxylic dianhydride and 4,4'-oxydianiline.

29. The laminate of claim 25 wherein the polyimide adhesives are selected from the adhesive group consisting of the reaction product of (a) 3,3', 4,4'-benzophenone tetracarboxylic dianhydride and 3,3'-diaminohenzophenone, (b) two parts 3,3', 4,4'-benzophenone tetracarboxylic dianhydride plus one part pyromellitic dianhydride and 3,3'-diaminohenzophenone, and (c) three parts 3,3', 4,4'-benzophenone tetracarboxylic dianhydride plus one part pyromellitic dianhydride and 4,4'-diaminohenzophenone.

30. The laminate of claim 25 including:
a layer of conductive metal film between each two layers of polyimide film and a layer of polyimide adhesive adjacent each surface of the metal film layer.

31. The laminate of claim 30 wherein the metal film layer is selected from the group consisting of aluminum, brass, chromium, titanium, copper, stainless steel and alloys thereof, each member of the group being in the thickness range of 1 mil to 30 mil.

32. A laminate of high-temperature polyimide film and metal foil comprising of:
at least two layers of thin polyimide film;
a metal foil layer between said two layers of polyimide film;
a thermoplastic polyimide adhesive layer between each surface of the metal foil layer and the adjacent polyimide film layer;
the polyimide film, metal foil and adhesive being assembled to form a film-adhesive-metal-adhesive-film sandwich;
said polyimide adhesive layer being formed from a polyamic acid imidized to remove its solvent and converted to the polyimide state prior to being assembled in the sandwich; and
said sandwich assembly being bonded together under heat and pressure to form a void-free laminate structure.

33. The laminate of claim 32 wherein the metal foil layer is selected from the group of metal foils consisting of copper, stainless steel, chromium, titanium, aluminum, brass, and alloys thereof.

34. The laminate of claim 32 wherein the polyimide adhesive is applied to the laminate surfaces in liquid form and consists of a polyamic acid dissolved in a solvent.

35. The laminate of claim 34 wherein the polyimide adhesive is a thin film of a polyimide that has been imidized prior to inclusion in the sandwich.

36. The laminate of claim 32 wherein the polyimide adhesive is a linear polyamic acid adhesive solution selected from the group consisting of the reaction products of:
 (a) 3,3', 4,4'-benzophenone tetracarboxylic dianhydride and 3,3'-diaminohenzophenone;
 (b) two parts 3,3', 4,4'-benzophenone tetracarboxylic dianhydride to one part pyromellitic dianhydride and 3,3'-diaminohenzophenone; and
 (c) three parts 3,3', 4,4'-benzophenone tetracarboxylic dianhydride to one part pyromellitic dianhydride and 4,4'-diaminohenzophenone, each group member being dissolved in a solvent.

37. The laminate of claim 36 wherein the adhesive solid concentration is approximately 15% and the solvent is selected from the group consisting of N,N'-dimethylacetamide, bis(2-methoxyethyl)ether, N,N-dimethylformamide, N-methyl-2-pyrrolidone, dimethylsulfoxide, tetrahydrofuran, m-dioxane, p-dioxane and 1,2-bis(2-methoxyethoxy)ethane.

38. A laminate of polyimide film and metal including:
 at least one layer of a thin polyimide film;
 at least on layer of a thin metallic film; and
 a layer of polyimide adhesive between said layer of polyimide film and said layer of metallic film;
 said layers having been bonded together by heat and pressure to form a substantially void-free laminate, and said layer of polyimide adhesive having been formed by imidizing a layer of polyamic acid prior to bonding said layers together.

39. A laminate as in claim 38 wherein:
 said layer of polyimide adhesive was formed by applying a layer of polyamic acid to one of said polyimide film or said metallic film and heating said layer of polyamic acid to imidize said layer to form said layer of polyimide.

40. A laminate as in claim 39 wherein:
 said layer of polyamic acid was applied to said layer of polyimide film.

41. A laminate as in claim 38 wherein:
 said layer of polyimide adhesive was formed as a free film by forming a layer of polyamic acid and heating said layer of polyamic acid to form said layer of polyimide.

42. A laminate as in claim 38 wherein:
 said polyimide adhesive is selected from the group consisting of the reaction products of:
 (a) 3,3', 4,4'-benzophenone tetracarboxylic dianhydride and 3,3'-diaminohenzophenone;
 (b) two parts 3,3', 4,4'-benzophenone tetracarboxylic dianhydride to one part pyromellitic dianhydride and 3,3'-diaminohenzophenone; and
 (c) three parts 3,3', 4,4'-benzophenone tetracarboxylic dianydride to one part pyromellitic dianhydride and 4,4'-dianimohenzophenone, each group member being dissolved in a solvent.

* * * * *